US009161128B2

(12) United States Patent
Harvey

(10) Patent No.: US 9,161,128 B2
(45) Date of Patent: Oct. 13, 2015

(54) ADJUSTABLE CANALPHONE SYSTEM

(71) Applicant: Jerry Harvey, Apopka, FL (US)

(72) Inventor: Jerry Harvey, Apopka, FL (US)

(*) Notice: Subject to any disclaimer, the term of this patent is extended or adjusted under 35 U.S.C. 154(b) by 0 days.

(21) Appl. No.: 14/509,605

(22) Filed: Oct. 8, 2014

(65) Prior Publication Data

US 2015/0098581 A1 Apr. 9, 2015

Related U.S. Application Data

(60) Provisional application No. 61/888,256, filed on Oct. 8, 2013.

(51) Int. Cl.
| | |
|---|---|
| *H04R 1/10* | (2006.01) |
| *H03G 5/00* | (2006.01) |
| *H04R 3/04* | (2006.01) |
| *H03G 3/20* | (2006.01) |
| *H04R 3/14* | (2006.01) |

(52) U.S. Cl.
CPC .. *H04R 3/04* (2013.01); *H03G 3/20* (2013.01); *H04R 1/1016* (2013.01); *H04R 1/1041* (2013.01); *H04R 3/14* (2013.01); *H04R 2205/022* (2013.01); *H04R 2420/09* (2013.01)

(58) Field of Classification Search
CPC .............. H04R 3/04; H04R 3/12; H04R 3/14; H04R 1/26; H04R 5/02; H04R 1/1061; H04R 25/652; H04R 2225/025; H03G 1/02; H03G 1/04; H03G 3/00; H03G 3/20
USPC ................ 381/312, 328, 71.6, 74, 99, 380; 181/128–137; 607/57; 600/25
See application file for complete search history.

(56) References Cited

U.S. PATENT DOCUMENTS

| | | | |
|---|---|---|---|
| 3,061,784 A | 10/1962 | Fibranz | |
| 4,429,181 A * | 1/1984 | Freadman | 381/99 |
| 4,742,887 A | 5/1988 | Yamagishi | |
| 6,633,648 B1 * | 10/2003 | Bauck | 381/303 |
| 7,194,102 B2 | 3/2007 | Harvey | |
| 7,194,103 B2 | 3/2007 | Harvey | |
| 7,263,195 B2 | 8/2007 | Harvey | |
| 7,317,806 B2 | 1/2008 | Harvey | |
| 7,489,794 B2 | 2/2009 | Harvey | |
| 7,634,099 B2 | 12/2009 | Harvey | |
| 7,672,469 B2 | 3/2010 | Dyer et al. | |
| 7,864,975 B2 | 1/2011 | Harvey | |
| 7,869,616 B2 | 1/2011 | Harvey | |
| 7,876,920 B2 | 1/2011 | Harvey | |
| 7,876,921 B2 | 1/2011 | Harvey | |
| 8,194,911 B2 * | 6/2012 | Dyer et al. | 381/382 |
| 8,897,463 B2 * | 11/2014 | Harvey | 381/99 |
| 2006/0193479 A1 | 8/2006 | Harvey | |
| 2006/0222185 A1 | 10/2006 | Dyer et al. | |
| 2007/0201717 A1 | 8/2007 | Dyer | |
| 2007/0223735 A1 | 9/2007 | LoPresti et al. | |
| 2008/0181443 A1 | 7/2008 | Harvey | |
| 2009/0041262 A1 | 2/2009 | Harvey | |
| 2009/0316944 A1 * | 12/2009 | Tiscareno et al. | 381/346 |
| 2013/0243216 A1 | 9/2013 | Harvey | |
| 2014/0301768 A1 | 10/2014 | Harvey | |

* cited by examiner

*Primary Examiner* — Xu Mei
(74) *Attorney, Agent, or Firm* — Douglas J. Visnius

(57) ABSTRACT

An audio system may include a canalphone housing, and a plurality of low frequency drivers carried by the canalphone housing. The system may also include a plurality of high frequency drivers carried by the canalphone housing, the plurality of high frequency drivers tuned to produce an audio trace in the 10 kilohertz to 22 kilohertz on an audio analyzer.

18 Claims, 6 Drawing Sheets

ADJUSTABLE CANALPHONE SYSTEM

CROSS-REFERENCE TO RELATED APPLICATIONS

This application claims the benefit of co-pending U.S. Provisional Application No. 61/888,256, filed 8 Oct. 2013. This application and the application identified above include identical inventorship and ownership.

BACKGROUND

The embodiments relate to the field of canalphones.

DESCRIPTION OF BACKGROUND

There are many different types of personal listening devices such as headphones, earbuds, canalphones, and/or the like. Headphones are personal listening devices that are held in close proximately to the ear by some support system. Earbuds are small personal listening devices that are positioned directly in front of the ear canal and are substantially smaller than a person's outer ear. Similarly, canalphones are personal listening devices that are substantially smaller than a person's outer ear, but they differ from earbuds in that they are placed directly in one end of the ear canal. Both earbuds and canalphones are held in positioned by friction between the ear and the device rather than the support system found in most headphones.

Canalphones are also referred to as in-ear monitors due to how the canalphone is worn by a listener. In other words, a canalphone housing is worn in the ear of the user and not over and/or around the ear of the user. Some canalphones also serve as earplugs due to the way the canalphone limits noise external to the canalphone from entering the ear canal.

SUMMARY

An audio system may include a canalphone housing, and a plurality of low frequency drivers carried by the canalphone housing. The system may also include a plurality of high frequency drivers carried by the canalphone housing, the plurality of high frequency drivers tuned to produce an audio trace in the 10 kilohertz to 22 kilohertz on an audio analyzer. The tuning of the plurality of high frequency drivers may eliminate the need for an equalizer. The plurality of low frequency drivers and the plurality of high frequency drivers may each be connected to a respective sound bore that provides an exit to the canalphone housing.

The system may further include a canalphone connector that includes four connectors of which a first connector carries an acoustical signal only for the plurality of low frequency drivers. The system may additionally include a controller in communication with the first connector so that the controller provides control of the plurality of low frequency drivers' bass response.

The system may also include a second connector that carries an acoustical signal only for the plurality of high frequency drivers, a third connector carries an acoustical signal only for a plurality of mid frequency drivers, and a fourth connector comprising a ground. The system may further include a controller in communication with the second connector so that the controller provides control of the plurality of high frequency drivers' treble response; and a controller in communication with the third connector so that the controller provides control of the plurality of mid frequency drivers' middle response.

The plurality of low frequency drivers and the plurality of high frequency drivers may each include four audio drivers. The plurality of low frequency drivers may each be connected to each other in of series, parallel, and/or series-parallel in order to adjust an impedance curve of the plurality of low frequency drivers' grouping; and the plurality of high frequency drivers may each be connected to each other in series, parallel, and/or series-parallel in order to adjust an impedance curve of the plurality of high frequency drivers' grouping.

The impedance curve adjustments may be part of the tuning of the plurality of low frequency drivers and/or the plurality of high frequency drivers.

Another aspect is a method that may comprise providing a plurality of low frequency drivers carried by a canalphone housing. The method may also include tuning a plurality of high frequency drivers carried by the canalphone housing to produce an audio trace in the 10 kilohertz to 22 kilohertz on an audio analyzer.

The method may further include eliminating the need for an equalizer by the tuning of the plurality of high frequency drivers. The method may additionally include connecting to a respective sound bore that provides an exit to the canalphone housing at least one of the plurality of low frequency drivers and the plurality of high frequency drivers.

The method may also include carrying an acoustical signal only for the plurality of low frequency drivers via a first connector of a canalphone connector. The method may further include communicating with the first connector via a controller so that the controller provides control of the plurality of low frequency drivers' bass response.

The method may additionally include carrying an acoustical signal only for the plurality of high frequency drivers via a second connector, carrying an acoustical signal only for a plurality of mid frequency drivers via a third connector, and a fourth connector comprising a ground. The method may also include controlling the plurality of high frequency drivers' treble response via a controller in communication with the second connector, and controlling the plurality of mid frequency drivers' middle response via a controller in communication with the third connector.

The method may further include four audio drivers for each of the plurality of low frequency drivers and the plurality of high frequency drivers. The method may additionally include connecting the plurality of low frequency drivers to each other in series, parallel, and/or series-parallel in order to adjust an impedance curve of the plurality of low frequency drivers' grouping, and connecting the plurality of high frequency drivers to each other in series, parallel, and/or series-parallel in order to adjust an impedance curve of the plurality of high frequency drivers' grouping. The method may also include tuning at least one of the plurality of low frequency drivers and the plurality of high frequency drivers via the impedance curve adjustments.

Another aspect is a system that may include a canalphone housing, and a plurality of high frequency drivers carried by the canalphone housing. The system may also include a plurality of low frequency drivers carried by the canalphone housing, and a passive crossover carried by the canalphone housing. The system may further include an amplifier connected to the canalphone housing to deliver an amplified sound signal from a source to the passive crossover. The system may additionally include a controller between the amplifier and the passive crossover to adjust the amplified sound signal at the plurality of high frequency drivers and the plurality of low frequency drivers.

The controller may include an adjustable attenuator. The controller may be a potentiometer, a voltage divider, a variable resistor, and/or the like.

The controller may include a plurality of adjustable attenuators that each controls a selected bandwidth. The system may also include a connector that enables the controller to be added or removed from the system.

The system may further include a plurality of mid frequency drivers carried by the canalphone housing. The connector may comprise a 4-pin connector.

The system may operate without the controller. The canalphone housing may be sealed which enables the plurality of low frequency drivers and the controller to provide the amplified sound signal with improved low frequency response.

Another aspect is a system including a canalphone housing comprising a sound outlet, and four 3-7 ohm high frequency drivers carried by the canalphone housing. The system may include a single tuned high frequency sound bore to connect the four 3-7 ohm high frequency drivers to the sound outlet to deliver a tuned high frequency sound signal. The system may also include four 3-7 ohm low frequency drivers carried by the canalphone housing. The system may further include a single tuned low frequency sound bore to connect the four 3-7 ohm low frequency drivers to the sound outlet to deliver a tuned low frequency sound signal, the tuned low frequency sound bore being shorter than the tuned high frequency sound bore.

The four 3-7 ohm high frequency drivers and the four 3-7 ohm low frequency drivers may provide more head room, lower distortion, a flatter phase curve, and/or are more efficient than other comparable driver combinations. The four 3-7 ohm high frequency drivers and the four 3-7 ohm low frequency drivers may comprise balanced armatures.

The four 3-7 ohm high frequency drivers may connect in the same plane as the single tuned high frequency sound bore. The four 3-7 ohm high frequency drivers may comprise like frequency response ranges, and the four 3-7 ohm low frequency drivers may comprise like frequency response ranges.

The four 3-7 ohm high frequency drivers' may be phase aligned within at least 0.02 milliseconds of each other, and the four 3-7 ohm low frequency drivers' may be phase aligned within at least 0.05 milliseconds of each other. The four 3-7 ohm high frequency drivers may be connected in parallel with each other and the four 3-7 ohm low frequency drivers may be connected in parallel and/or series with each other. The canalphone housing may be sealed which enables the four 3-7 ohm low frequency drivers and the controller to provide the amplified sound signal with improved low frequency response.

Another aspect is a system that may include a canalphone housing comprising a sound outlet, and four 3-7 ohm high frequency drivers carried by the canalphone housing. The system may also include a single tuned high frequency sound bore to connect the four 3-7 ohm high frequency drivers to the sound outlet to deliver a tuned high frequency sound wave, and four 3-7 ohm low frequency drivers carried by the canalphone housing. The system may further include a single tuned low frequency sound bore to connect the four 3-7 ohm low frequency drivers to the sound outlet to deliver a tuned low frequency sound wave, the tuned low frequency sound bore being shorter than the tuned high frequency sound bore. The system may additionally include a passive crossover carried by the canalphone housing, an amplifier connected to the canalphone housing to deliver an amplified sound signal from a source to the passive crossover, and a controller between the amplifier and the passive crossover to adjust the amplified sound signal at the plurality of high frequency drivers and the plurality of low frequency drivers.

The controller may comprise an adjustable attenuator. The controller may comprise a potentiometer, a voltage divider, a variable resistor, and/or the like.

The controller may include a plurality of adjustable attenuators that each controls a selected bandwidth. The system may also include a connector that enables the controller to be added or removed from the system.

The system may further comprise a plurality of mid frequency drivers carried by the canalphone housing. The connector may comprise a 4-pin connector.

The system may operate without the controller. The four 3-7 ohm high frequency drivers and the four 3-7 ohm low frequency drivers may provide more head room, lower distortion, a flatter phase curve, and/or are more efficient than other comparable driver combinations.

The four 3-7 ohm high frequency drivers and the four 3-7 ohm low frequency drivers may comprise balanced armatures. The four 3-7 ohm high frequency drivers may connect in the same plane to the single tuned high frequency sound bore.

The four 3-7 ohm high frequency drivers may comprise like frequency response ranges, and the four 3-7 ohm low frequency drivers may comprise like frequency response ranges.

The four 3-7 ohm high frequency drivers' may be phase aligned within at least 0.02 milliseconds of each other, and the four 3-7 ohm low frequency drivers' may be phase aligned within at least 0.05 milliseconds of each other.

The four 3-7 ohm high frequency drivers may be connected in parallel with each other, and the four 3-7 ohm low frequency drivers may be connected in parallel and/or series with each other.

The canalphone housing may be sealed which enables the four 3-7 ohm low frequency drivers and the controller to provide the amplified sound signal with improved low frequency response. The analyzer may comprise a spectrum analyzer, wave analyzer, and/or the like.

DETAILED DESCRIPTION

Embodiments will now be described more fully hereinafter with reference to the accompanying drawings, in which preferred embodiments are shown. Like numbers refer to like elements throughout.

Figure 1:
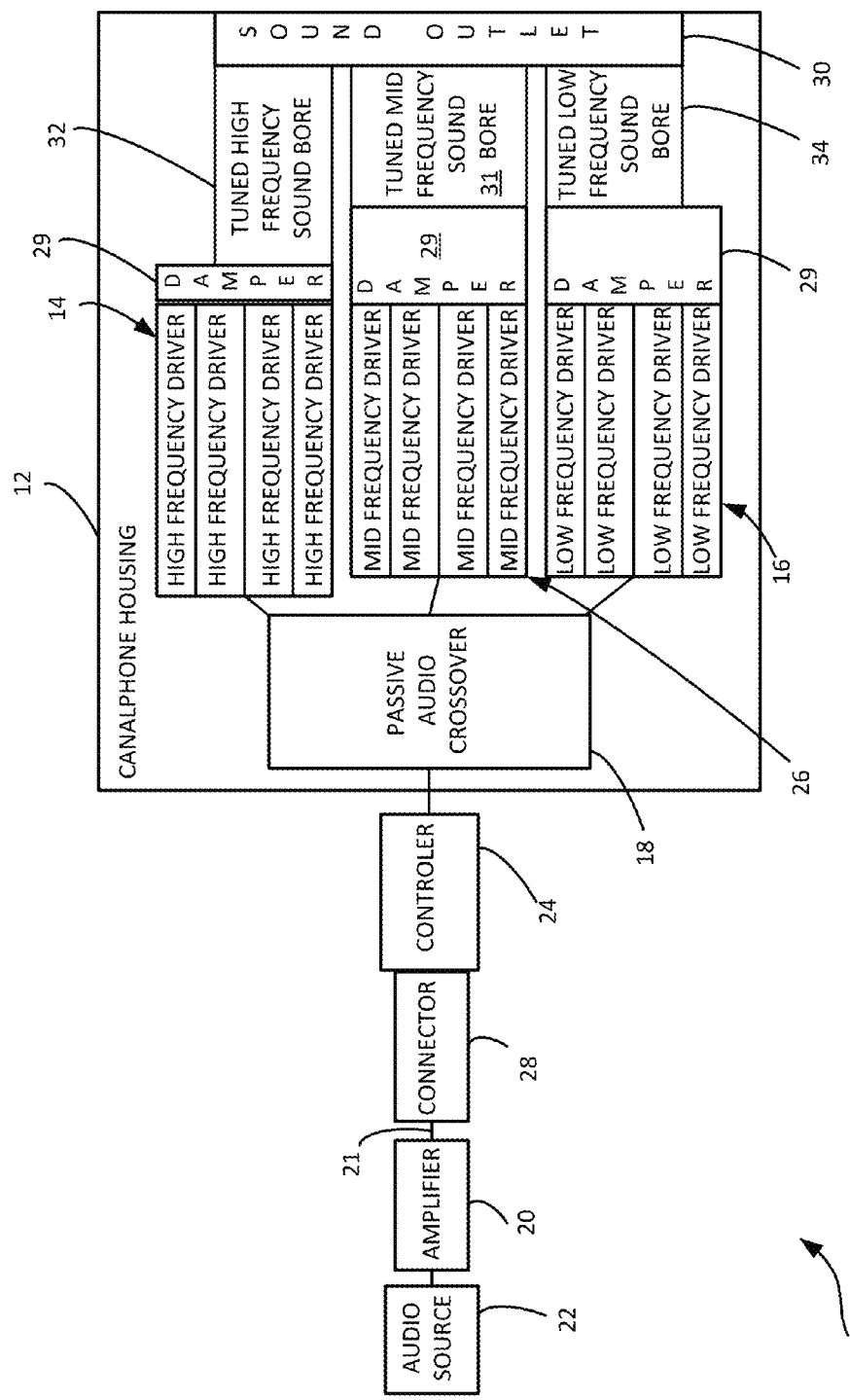
FIG. 1 is a schematic block diagram of a system in accordance with various embodiments.
Figure 4:
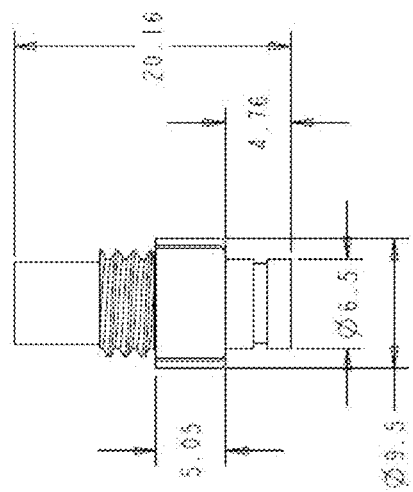
FIG. 4 is a schematic diagram of portions of the exemplary canalphone connector in FIG. 3.
Figure 3:
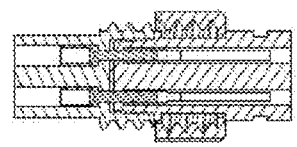
FIG. 3 is a cross-sectional view of the exemplary canalphone connector in FIG. 2.
Figure 2:
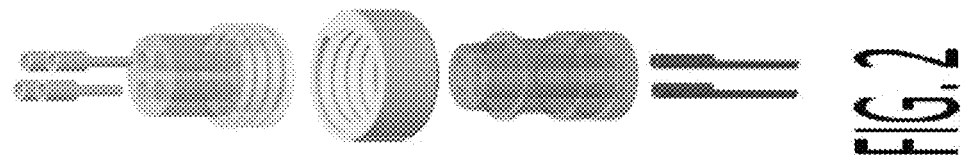
FIG. 2 is an exploded diagram of an exemplary canalphone connector in accordance with various embodiments.
Figure 5:
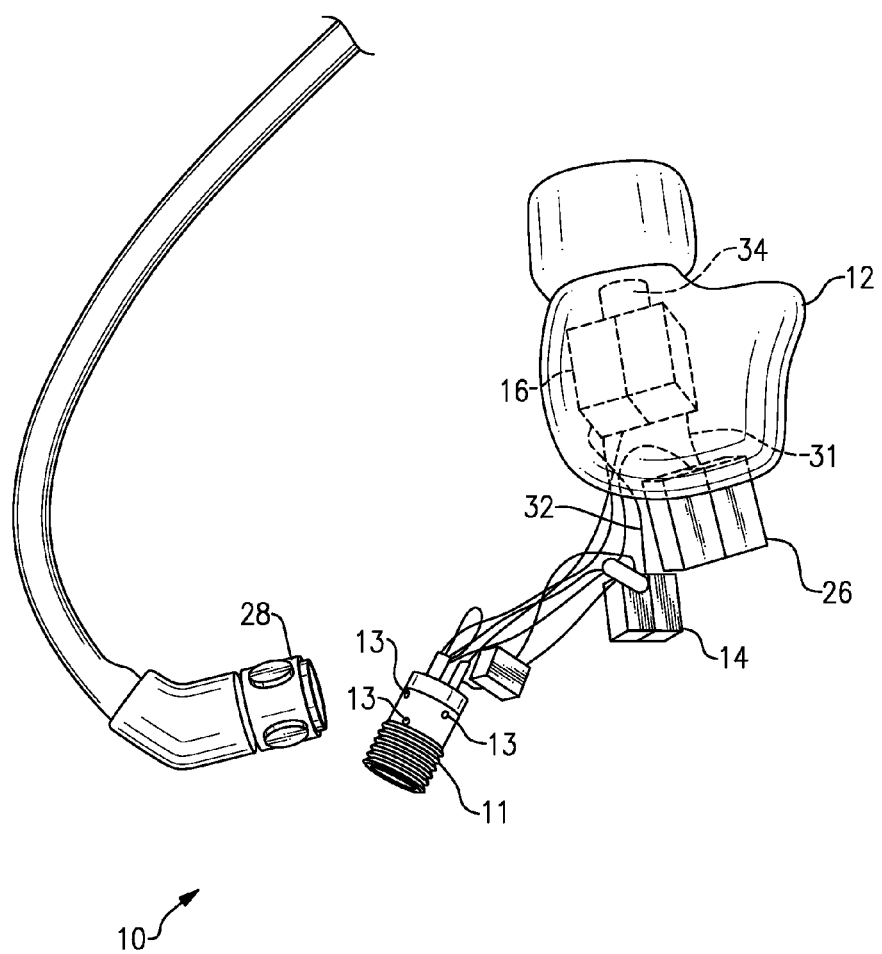
FIG. 5 illustrates a system in accordance with various embodiments of FIG. 1.
Figure 6:
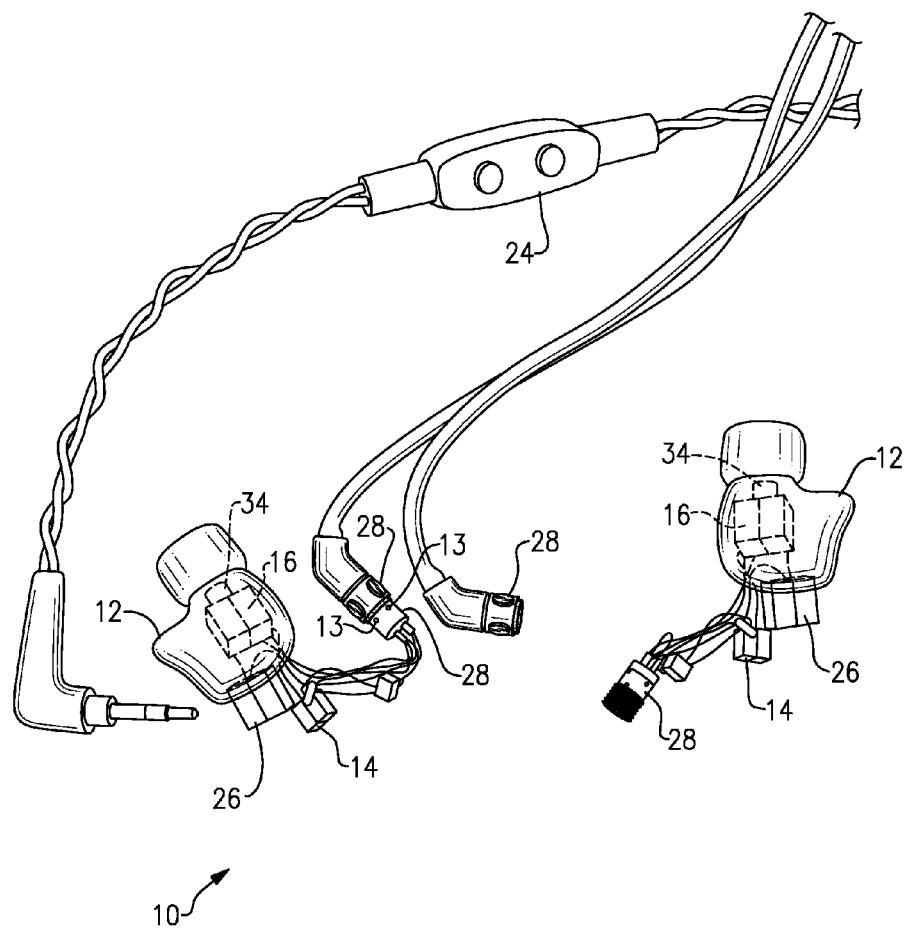
FIG. 6 illustrates a system in accordance with various embodiments of FIG. 1.
Figure 7:
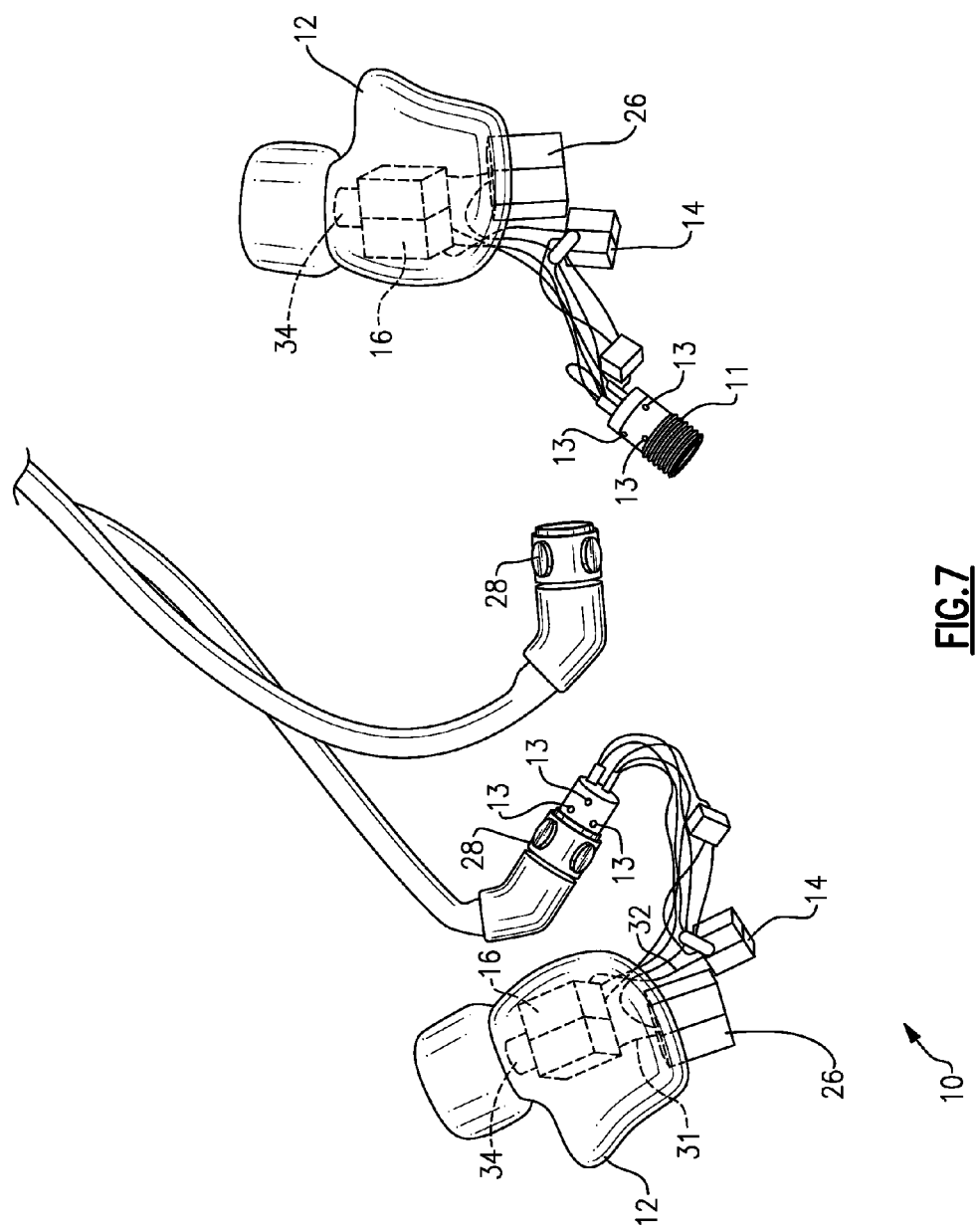
FIG. 7 illustrates a system in accordance with various embodiments of FIG. 1.
Figure 8:
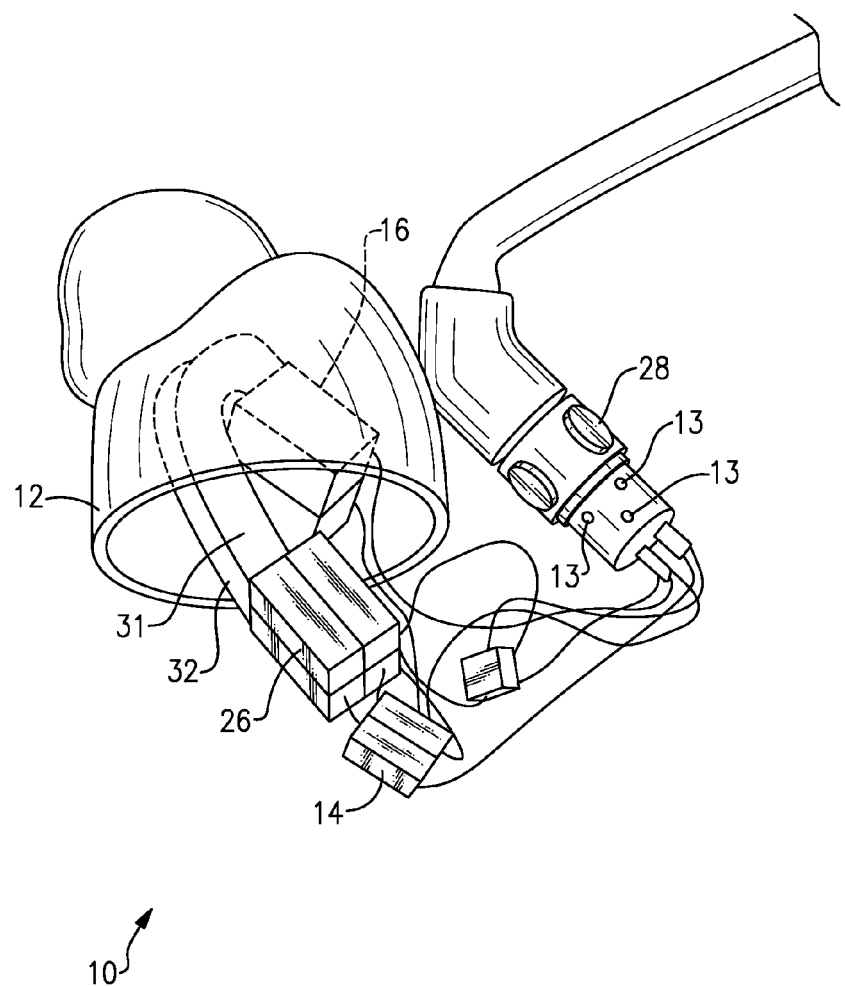
FIG. 8 illustrates a system in accordance with various embodiments of FIG. 1.

With reference now to FIGS. 1-4, a canalphone system 10 is initially described. The system 10 includes a canalphone housing 12 that frictionally engages the ear of a user (not shown) in its usage position. The system 10 also includes a plurality of high frequency drivers 14 carried by the canalphone housing 12, and a plurality of low frequency drivers 16 carried by the canalphone housing. The system 10 further includes a passive crossover 18 carried by the canalphone housing 12, and an amplifier 20 connected to the canalphone housing to deliver an amplified sound signal 21 from a source 22 to the passive crossover. The system 10 additionally includes a controller 24 between the amplifier 20 and the passive crossover 18 to adjust the amplified sound signal at the plurality of high frequency drivers 14 and the plurality of low frequency drivers 16.

In one embodiment, the amplifier 20 comprises a full range circuit that provides a full range signal to the passive crossover 18. In another embodiment, the amplifier 20 includes a plurality of amplifiers.

In one embodiment, the controller 24 comprises an adjustable attenuator. In another embodiment, the controller 24 comprises a potentiometer, a voltage divider, and a variable resistor. In another embodiment, the controller 24 includes a plurality of adjustable attenuators that each controls a selected bandwidth.

For example, there is an adjustable attenuator for a high frequency band, a mid frequency band, and a low frequency band. In another embodiment, there are two adjustable attenuators for the high frequency band, the mid frequency band, and the low frequency band.

In one embodiment, the system 10 also includes a connector 28 that enables the controller 24 to be added or removed from the system. In another embodiment, the connector 28 attaches to each side of the controller 24. In another embodiment, the system further includes a plurality of mid frequency drivers 31 carried by the canalphone housing 12. In another embodiment, the connector 28 comprises a 4-pin connector.

In one embodiment, the system 10 operates without the controller 24. Stated another way, the controller 24 can be removed from the system 10 and the system will still operate. In another embodiment, the canalphone housing 12 is sealed which enables the plurality of low frequency drivers 16 and the controller 24 to provide the amplified sound signal with improved low frequency response. For instance, the sealed housing improves the transient response of the system 10 compared to an ambient vent canalphone housing.

In an alternative embodiment, the system 10 includes a canalphone housing 12 including a sound outlet 30. The system also includes four 3-7 ohm high frequency drivers 14 carried by the canalphone housing 12, and a single tuned high frequency sound bore 32 to connect the four 3-7 ohm high frequency drivers 14 to the sound outlet 30 to deliver a tuned high frequency sound signal. The system further includes four 3-7 ohm low frequency drivers 16 carried by the canalphone housing 12, and a single tuned low frequency sound bore 34 to connect the four 3-7 ohm low frequency drivers to the sound outlet 30 to deliver a tuned low frequency sound signal, the tuned low frequency sound bore being shorter than the tuned high frequency sound bore 32. The tuned low frequency sound bore 34 is sized shorter than the tuned high frequency sound bore 32 to keep the low frequency signal substantially in phase with the high frequency signal.

In one embodiment, the system 10 includes 4 high frequency drivers 14, 4 mid frequency drivers 26, 4 low frequency drivers 16, a single tuned high frequency sound bore 32, a single tuned mid frequency sound bore 31, and a single tuned low frequency sound bore 34 with the canalphone housing 12. In another embodiment, the In another embodiment, the system 10 also includes an acoustic damper 29 that is carried by the single tuned high frequency sound bore 32, the single tuned mid frequency sound bore 31, and/or the single tuned low frequency sound bore 34.

In one embodiment, the four 3-7 ohm high frequency drivers 14 and the four 3-7 ohm low frequency drivers 16 provide more head room, lower distortion, a flatter phase curve, and are more efficient than other comparable driver combinations. In another embodiment, the four 3-7 ohm high frequency drivers 14 and the four 3-7 ohm low frequency drivers 16 comprise balanced armatures.

In one embodiment, the four 3-7 ohm high frequency drivers 14 connect in a same plane as the single tuned high frequency sound bore 32. In another embodiment, the four 3-7 ohm high frequency drivers 14 comprise like frequency response ranges, and the four 3-7 ohm low frequency drivers 16 comprise like frequency response ranges.

In one embodiment, the four 3-7 ohm high frequency drivers' 14 are phase aligned within at least 0.02 milliseconds of each other, and the four 3-7 ohm low frequency drivers' 16 are phase aligned within at least 0.05 milliseconds of each other. In another embodiment, the four 3-7 ohm high frequency drivers 14 are connected in parallel with each other, and the four 3-7 ohm low frequency drivers 16 are connected in at least one of parallel and series with each other. In another embodiment, the canalphone housing 12 is sealed which enables the four 3-7 ohm low frequency drivers 16 and the controller 24 to provide the amplified sound signal with improved low frequency response.

In another alternative embodiment, the system 10 includes a canalphone housing 12 including a sound outlet 30. The system also includes four 3-7 ohm high frequency drivers 14 carried by the canalphone housing 12, and a single tuned high frequency sound bore 32 to connect the four 3-7 ohm high frequency drivers 14 to the sound outlet 30 to deliver a tuned high frequency sound signal. The system further includes four 3-7 ohm low frequency drivers 16 carried by the canalphone housing 12, and a single tuned low frequency sound bore 34 to connect the four 3-7 ohm low frequency drivers to the sound outlet 30 to deliver a tuned low frequency sound signal, the tuned low frequency sound bore being shorter than the tuned high frequency sound bore 32. The system 10 additionally includes a passive crossover 18 carried by the canalphone housing 12, and an amplifier 20 connected to the canalphone housing to deliver an amplified sound signal from a source 22 to the passive crossover. The system also includes a controller 24 between the amplifier 20 and the passive crossover 18 to adjust the amplified sound signal at the plurality of high frequency drivers 14 and the plurality of low frequency drivers 16.

In one embodiment, the controller 24 comprises an adjustable attenuator. In another embodiment, the controller 24 comprises a potentiometer, a voltage divider, and a variable resistor. In one embodiment, the controller 24 includes a plurality of adjustable attenuators that each controls a selected bandwidth.

In one embodiment, the system 10 also includes a connector 28 that enables the controller 24 to be added or removed from the system 10. In another embodiment, the system 10 further includes a plurality of mid frequency drivers 31 carried by the canalphone housing 12. In another embodiment, the connector 28 comprises a 4-pin connector.

In one embodiment, the system 10 operates without the controller 24. In another embodiment, the four 3-7 ohm high frequency drivers 14 and the four 3-7 ohm low frequency drivers 16 provide more head room, lower distortion, a flatter phase curve, and are more efficient than other comparable driver combinations.

In one embodiment, the four 3-7 ohm high frequency drivers 14 and the four 3-7 ohm low frequency drivers 16 comprise balanced armatures. In another embodiment, the four 3-7 ohm high frequency drivers 14 connect in a same plane as the single tuned high frequency sound bore 32.

In one embodiment, the four 3-7 ohm high frequency drivers 14 comprise like frequency response ranges, and the four 3-7 ohm low frequency drivers 16 comprise like frequency response ranges. In another embodiment, the four 3-7 ohm high frequency drivers' 14 are phase aligned within at least 0.02 milliseconds of each other, and the four 3-7 ohm low frequency drivers' 16 are phase aligned within at least 0.05 milliseconds of each other.

In one embodiment, the four 3-7 ohm high frequency drivers 14 are connected in parallel with each other and the four 3-7 ohm low frequency drivers 16 are connected in at least one of parallel and series with each other. In another embodiment, the canalphone housing 12 is sealed which enables the four 3-7 ohm low frequency drivers 16 and the controller 24 to provide the amplified sound signal with improved low frequency response.

In another embodiment, the system 10 includes a canalphone housing 12 and a plurality of low frequency drivers 16 carried by the canalphone housing. The system 10 may also include a plurality of high frequency drivers 14 carried by the canalphone housing 12, and the plurality of high frequency drivers are tuned to produce an audio trace in the 10 kilohertz to 22 kilohertz on an audio analyzer (not shown). The analyzer comprises a spectrum analyzer, wave analyzer, and/or the like.

In one embodiment, the tuning of the plurality of high frequency drivers 14 reduces and/or eliminates the need for an equalizer. In another embodiment, the tuning of the plurality of low frequency drivers 16 reduces and/or eliminates the need for an equalizer. In another embodiment, the tuning of the plurality of mid frequency drivers 26 reduces and/or eliminates the need for an equalizer.

In one embodiment, the plurality of low frequency drivers 16 and/or the plurality of high frequency drivers 14 are each connected to a respective sound bore 34 and 32 that provides an exit to the canalphone housing 12. In another embodiment, the plurality of mid frequency drivers 26 is connected to a sound bore 31 that provides an exit to the canalphone housing 12.

In one embodiment, the system 10 further comprises a canalphone connector 28 that includes four connectors 13 of which a first connector carries an acoustical signal only for the plurality of low frequency drivers 16. The connector 28 includes two parts that are mated together. For example, the connector 28 includes male threads 11 that engage the other mated side of the connector. In another embodiment, the system 10 additionally includes a controller 24 in communication with the first connector 13 so that the controller provides control of the plurality of low frequency drivers' 16 bass response.

In one embodiment, the system 10 also includes a second connector 13 that carries an acoustical signal only for the plurality of high frequency drivers 14, a third connector 13 that carries an acoustical signal only for a plurality of mid frequency drivers 26, and a fourth connector 13 comprising a ground. In another embodiment, the system 10 further includes a controller 24 in communication with the second connector 13 so that the controller provides control of the plurality of high frequency drivers' 14 treble response, and a controller in communication with the third connector 13 so that the controller provides control of the plurality of mid frequency drivers' 26 middle response.

In one embodiment, the plurality of low frequency drivers 16 and the plurality of high frequency drivers 14 each include four audio drivers. In another embodiment, the plurality of low frequency drivers 16 are each connected to each other in series, parallel, and/or series-parallel in order to adjust an impedance curve of the plurality of low frequency drivers' grouping, and wherein the plurality of high frequency drivers 14 are each connected to each other in series, parallel, and/or series-parallel in order to adjust an impedance curve of the plurality of high frequency drivers' grouping. In another embodiment, the impedance curve adjustments are part of the tuning of the plurality of low frequency drivers 16 and/or the plurality of high frequency drivers 14.

In a method embodiment, the method may include providing a plurality of low frequency drivers 16 carried by a canalphone housing 12. The method may also include tuning a plurality of high frequency drivers 14 carried by the canalphone housing 12 to produce an audio trace in the 10 kilohertz to 22 kilohertz on an audio analyzer.

In one embodiment, the method may further include eliminating the need for an equalizer by the tuning of the plurality of high frequency drivers 14. In another embodiment, the method may additionally include connecting to a respective sound bore 34 and 32 that provides an exit to the canalphone housing 12 for the plurality of low frequency drivers 16 and/or the plurality of high frequency drivers 14.

In one embodiment, the method may also include carrying an acoustical signal only for the plurality of low frequency drivers 16 via a first connector 13 of a canalphone connector 28. In another embodiment, the method may further include communicating with the first connector 13 via a controller 24 so that the controller provides control of the plurality of low frequency drivers' 16 bass response.

In one embodiment, the method may additionally include carrying an acoustical signal only for the plurality of high frequency drivers 14 via a second connector 13, carrying an acoustical signal only for a plurality of mid frequency drivers 26 via a third connector 13, and a fourth connector 13 comprising a ground. In another embodiment, the method may also include controlling the plurality of high frequency drivers' 14 treble response via a controller 24 in communication with the second connector 13, and controlling the plurality of mid frequency drivers' 26 middle response via a controller 24 in communication with the third connector 13.

In one embodiment, the method further comprises including four audio drivers for each of the plurality of low frequency drivers 16 and the plurality of high frequency drivers 14. In another embodiment, the method additionally includes connecting the plurality of low frequency drivers 16 to each other in series, parallel, and/or series-parallel in order to adjust an impedance curve of the plurality of low frequency drivers' grouping, and connecting the plurality of high frequency drivers 14 to each other in series, parallel, and/or series-parallel in order to adjust an impedance curve of the plurality of high frequency drivers' grouping. In another embodiment, the method also includes tuning the plurality of low frequency drivers 16 and/or the plurality of high frequency drivers 14 via the impedance curve adjustments.

Since a canalphone housing 12 is very small, it is very difficult to achieve any of the preceding embodiments. However, system 10 overcomes the technical hurdles of providing more components in less space, providing superior sound reproduction, and provides a user a phase corrected canalphone system.

As will be appreciated by one skilled in the art, aspects may be embodied as a system and/or method. The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the various embodiments with various modifications as are suited to the particular use contemplated.

While the preferred embodiment has been described, it will be understood that those skilled in the art, both now and in the future, may make various improvements and enhancements which fall within the scope of the claims which follow. These claims should be construed to maintain the proper protection for the embodiments first described.

Aspects of the embodiments are described above with reference to flowchart illustrations and/or block diagrams of methods and systems (apparatus) according to the embodiments. The flowchart and block diagrams in the Figures illustrate the architecture, functionality, and operation of possible implementations of systems and methods according to various embodiments. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the various embodiments with various modifications as are suited to the particular use contemplated.

While the preferred embodiment has been described, it will be understood that those skilled in the art, both now and in the future, may make various improvements and enhancements which fall within the scope of the claims which follow. These claims should be construed to maintain the proper protection for the embodiments first described.

What is claimed is:

1. A system comprising:
a canalphone housing;
a plurality of low frequency drivers carried by the canalphone housing, the plurality of low frequency drivers are each connected to each other in at least one of series, parallel, and series-parallel in order to adjust an impedance curve of the plurality of low frequency drivers' grouping; and
a plurality of high frequency drivers carried by the canalphone housing, the plurality of high frequency drivers tuned to produce an audio trace in the 10 kilohertz to 22 kilohertz on an audio analyzer, the plurality of high frequency drivers are each connected to each other in at least one of series, parallel, and series-parallel in order to adjust an impedance curve of the plurality of high frequency drivers' grouping.

2. The system of claim 1 wherein the tuning of the plurality of high frequency drivers eliminates the need for an equalizer for the plurality of high frequency drivers.

3. The system of claim 1 wherein at least one of the plurality of low frequency drivers and the plurality of high frequency drivers are each connected to a respective sound bore that provides an exit to the canalphone housing.

4. The system of claim 1 further comprising a second connector that carries an acoustical signal only for the plurality of high frequency drivers, a third connector carries an acoustical signal only for a plurality of mid frequency drivers, and a fourth connector comprising a ground.

5. The system of claim 4 further comprising a controller in communication with the second connector so that the controller provides control of the plurality of high frequency drivers' treble response; and a controller in communication with the third connector so that the controller provides control of the plurality of mid frequency drivers' middle response.

6. The system of claim 1 wherein the plurality of low frequency drivers and the plurality of high frequency drivers each include four audio drivers.

7. The system of claim 1 wherein the impedance curve adjustments are part of the tuning of at least one of the plurality of low frequency drivers and the plurality of high frequency drivers.

8. The system of claim 1 further comprising a plurality of mid frequency drivers carried by the canalphone housing.

9. The system of claim 1 further comprising a canalphone connector that includes four connectors of which a first connector carries an acoustical signal only for the plurality of low frequency drivers.

10. The system of claim 9 wherein the connector comprises a 4-pin connector.

11. The system of claim 9 further comprising a controller in communication with the first connector so that the controller provides control of the plurality of low frequency drivers' bass response.

12. The system of claim 11 wherein the controller comprises an adjustable attenuator.

13. The system of claim 11 wherein the controller comprises a potentiometer, a voltage divider, and a variable resistor.

14. The system of claim 11 wherein the controller includes a plurality of adjustable attenuators that each controls a selected bandwidth.

15. The system of claim 11 further comprising a connector that enables the controller to be added or removed from the system.

16. The system of claim 15 wherein the controller is removable from the system and the system will still operate.

17. The system of claim 11 wherein the canalphone housing is sealed which enables the plurality of low frequency drivers and the controller to provide the amplified sound signal with improved low frequency response.

18. A system comprising:
a canalphone housing;
a plurality of high frequency drivers carried by the canalphone housing, the plurality of high frequency drivers tuned to produce an audio trace in the 10 kilohertz to 22 kilohertz on an audio analyzer, the plurality of high frequency drivers are each connected to each other in at least one of series, parallel, and series-parallel in order to adjust an impedance curve of the plurality of high frequency drivers' grouping;
a plurality of low frequency drivers carried by the canalphone housing, the plurality of low frequency drivers are each connected to each other in at least one of series, parallel, and series-parallel in order to adjust an impedance curve of the plurality of low frequency drivers' grouping;
a passive crossover carried by the canalphone housing;
an amplifier connected to the canalphone housing to deliver an amplified sound signal from a source to the passive crossover; and
a controller between the amplifier and the passive crossover to adjust the amplified sound signal at the plurality of high frequency drivers and the plurality of low frequency drivers.

* * * * *